United States Patent
Nagatsu et al.

(10) Patent No.: US 9,890,452 B2
(45) Date of Patent: *Feb. 13, 2018

(54) TANTALUM SPUTTERING TARGET, METHOD FOR MANUFACTURING SAME, AND BARRIER FILM FOR SEMICONDUCTOR WIRING FORMED BY USING TARGET

(71) Applicant: JX Nippon Mining & Metals Corporation, Tokyo (JP)

(72) Inventors: Kotaro Nagatsu, Ibaraki (JP); Shinichiro Senda, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 479 days.

This patent is subject to a terminal disclaimer.

(21) Appl. No.: 14/384,749

(22) PCT Filed: Mar. 19, 2013

(86) PCT No.: PCT/JP2013/057790
§ 371 (c)(1),
(2) Date: Sep. 12, 2014

(87) PCT Pub. No.: WO2013/141231
PCT Pub. Date: Sep. 26, 2013

(65) Prior Publication Data
US 2015/0064056 A1 Mar. 5, 2015

(30) Foreign Application Priority Data
Mar. 21, 2012 (JP) ................................. 2012-063157

(51) Int. Cl.
| | | |
|---|---|---|
| C23C 14/34 | (2006.01) |
| C22F 1/18 | (2006.01) |
| C22C 27/02 | (2006.01) |
| B22D 21/06 | (2006.01) |
| C23C 14/14 | (2006.01) |
| H01J 37/34 | (2006.01) |
| H01L 21/285 | (2006.01) |
| H01L 21/768 | (2006.01) |

(52) U.S. Cl.
CPC .......... *C23C 14/3414* (2013.01); *B22D 21/06* (2013.01); *C22C 27/02* (2013.01); *C22F 1/18* (2013.01); *C23C 14/14* (2013.01); *H01J 37/3426* (2013.01); *H01J 2237/332* (2013.01); *H01L 21/2855* (2013.01); *H01L 21/76843* (2013.01)

(58) Field of Classification Search
CPC .. C23C 14/14; C23C 14/3414; H01J 37/3426; H01J 2237/332; B22D 21/06; C22C 27/02; C22F 1/18; H01L 21/2855; H01L 21/76843
See application file for complete search history.

(56) References Cited

U.S. PATENT DOCUMENTS

| | | |
|---|---|---|
| 6,331,233 B1 | 12/2001 | Turner |
| 6,348,139 B1 | 2/2002 | Shah et al. |
| 6,589,311 B1 | 7/2003 | Han et al. |
| 6,759,143 B2 | 7/2004 | Oda et al. |
| 7,081,148 B2 | 7/2006 | Koenigsmann et al. |
| 7,156,963 B2 | 1/2007 | Oda |
| 7,716,806 B2 | 5/2010 | Oda |
| 7,740,717 B2 | 6/2010 | Oda |
| 7,892,367 B2 | 2/2011 | Oda |
| 7,998,287 B2 | 8/2011 | Wickersham et al. |
| 8,172,960 B2 | 5/2012 | Oda et al. |
| 8,231,745 B2 | 7/2012 | Wickersham et al. |
| 8,425,696 B2 | 4/2013 | Oda et al. |
| 2005/0241386 A1 | 11/2005 | Matera et al. |
| 2007/0209741 A1 | 9/2007 | Carpenter et al. |
| 2007/0240795 A1* | 10/2007 | Sato .......................... C22F 1/18 148/668 |
| 2011/0266145 A1 | 11/2011 | Fukushima et al. |
| 2012/0031756 A1 | 2/2012 | Fukushima et al. |
| 2012/0037501 A1 | 2/2012 | Fukushima et al. |
| 2012/0267236 A1 | 10/2012 | Nakashima et al. |
| 2012/0318668 A1 | 12/2012 | Tsukamoto |
| 2013/0092534 A1 | 4/2013 | Senda et al. |
| 2013/0098759 A1 | 4/2013 | Senda et al. |
| 2014/0174917 A1 | 6/2014 | Tsukamoto |

FOREIGN PATENT DOCUMENTS

| | | |
|---|---|---|
| JP | 06-264232 A | 9/1994 |
| JP | 2004-027358 A | 1/2004 |

* cited by examiner

Primary Examiner — Jessee Roe
(74) Attorney, Agent, or Firm — Howson & Howson LLP

(57) ABSTRACT

Provided is a tantalum sputtering target, which is characterized that an average crystal grain size of the target is 50 μm or more and 200 μm or less, and variation of a crystal grain size in the target plane is 40% or higher and 60% or less. This invention aims to provide a tantalum sputtering target capable of improving the uniformity of the film thickness and reducing the variation of the resistance value (sheet resistance).

2 Claims, 1 Drawing Sheet

TANTALUM SPUTTERING TARGET, METHOD FOR MANUFACTURING SAME, AND BARRIER FILM FOR SEMICONDUCTOR WIRING FORMED BY USING TARGET

FIELD

The present invention relates to a tantalum sputtering target that is used for forming a barrier film of a copper wiring in a semiconductor device such as an LSI.

BACKGROUND

With a semiconductor device having a multi-layer wiring structure, the diffusion of copper to the interlayer dielectric film is prevented by forming a barrier film, which is made from tantalum or the like, below the copper wiring This kind of tantalum barrier film is generally formed by sputtering a tantalum target.

In recent years, in line with the advancement of miniaturization of the wiring pursuant to the higher level of integration of semiconductor devices, there are demands for forming a barrier film with a uniform film thickness on narrow wiring grooves or fine via holes, and additionally demanded is the reduction in the variation of the resistance value (sheet resistance value) of the barrier film associated with the foregoing miniaturization.

A tantalum target is generally produced as follows; specifically, an ingot or a billet obtained by subjecting a tantalum raw material to electron beam melting and casting is forged, annealed, rolled, heat-treated, and subject to finish processing. Here, the following techniques are known in relation to a tantalum target and a production method thereof.

For example, Patent Document 1 describes that, by producing a tantalum target comprising a crystal structure in which the crystal orientation positioned at the center plane of the target is preferential to (222), it is possible to improve the structure of the crystal orientation of the target, improve the uniformity of the film upon performing sputtering, improve the quality of sputter deposition, and considerably improve the production yield.

Patent Document 2 describes that, by producing a tantalum target in which the area ratio of crystals having one orientation among (100), (111), and (110) does not exceed 0.5 when the sum of the overall crystal orientation is 1, it is possible to achieve superior deposition characteristics such as increased deposition rate, improved film uniformity, and lower generation of arcing and particles, and further possible to achieve favorable utilization efficiency of the target.

Patent Document 3 describes that, by adopting a production method including the step of clock-rolling a metal material, it is possible to reduce the texture band, and obtain a grain structure that is uniform across the entire surface and thickness of the metal material. Patent Document 3 further describes that the true strain resulting from the forging process can be made to be approximately 0.75 to approximately 2.0.

PRIOR ART DOCUMENT

Patent Document

Patent Document 1: JP-A-2004-27358
Patent Document 2: International Publication No. 2005/045090
Patent Document 3: Japanese Unexamined Patent Application Publication (Translation of PCT Application) No. 2008-532765

SUMMARY

Generally speaking, when a barrier film of a fine wiring is formed by sputtering a tantalum sputtering, there is a problem in that the quality of the semiconductor device will deteriorate as a result of the film thickness becoming uneven or the resistance value of the film becoming varied.

In order to resolve the foregoing problem, as described in the Patent Documents listed above, considered may be aligning the orientation of the crystals configuring the sputtering target to a specific orientation or dispersing the crystals at random in order to improve the uniformity of the sputtered film.

Nevertheless, in light of the ultra-fine wiring pursuant to the higher level of integration of semiconductor devices in recent years, it is necessary to further improve the uniformity of the thin films obtained through sputter deposition, and it is also necessary to strictly control the variation in the resistance value (sheet resistance) of the film, and the adjustment of the crystal orientation alone is no longer sufficient.

Thus, in light of the foregoing problems, an object of this invention is to provide a tantalum sputtering target capable of further improving the film thickness uniformity of the thin film formed via sputtering, and additionally reducing the variation in the resistance value (sheet resistance) of the film.

In order to resolve the foregoing problems, as a result of intense study, the present inventors discovered that the variation in the crystal grain size of the target can be controlled by controlling the amount of true strain during the forging process, and that it is thereby possible to further improve the uniformity of the film thickness of the thin film that is formed by sputtering this target, and additionally reduce the variation in the resistance value (sheet resistance) of the foregoing film.

Based on the foregoing discovery, the present invention provides:

1) A tantalum sputtering target, wherein an average crystal grain size of the target is 50 µm or more and 200 µm or less, and variation of a crystal grain size in the target plane is 40% or higher and 60% or less;

2) A barrier film for a semiconductor wiring formed by using the tantalum sputtering target according to 1) above, wherein variation of sheet resistance Rs relative to the target life is 5.0% or less, and variation of film thickness uniformity relative to the target life is 5.0% or less; and 3) A method of producing a tantalum target, wherein an ingot or a billet obtained by subjecting a tantalum raw material to electron beam melting and casting is heat-treated at 900° C. or higher and 1400° C. or less, subsequently forged, thereafter heat-treated at 850° C. or higher and 1100° C. or less to attain a true strain of 3.0 or more and 5.0 or less, subsequently rolled at a rolling reduction of 80% or higher and 90% or less, thereafter heat-treated at 750° C. or higher and 1000° C. or less, and additionally subject to finish processing to obtain a target shape.

As described above, it is possible to obtain a sputtering target with an extremely uniform crystal grain size by controlling the amount of true strain during the forging process upon producing a sputtering target.

Moreover, the sputtering target adjusted as described above yields a superior effect of being able considerably improve the film thickness uniformity relative to the target life of the thin film formed via sputtering, and additionally reduce the variation in the resistance value (sheet resistance) relative to the target life of the thin film.

DETAILED DESCRIPTION

Figure 1:
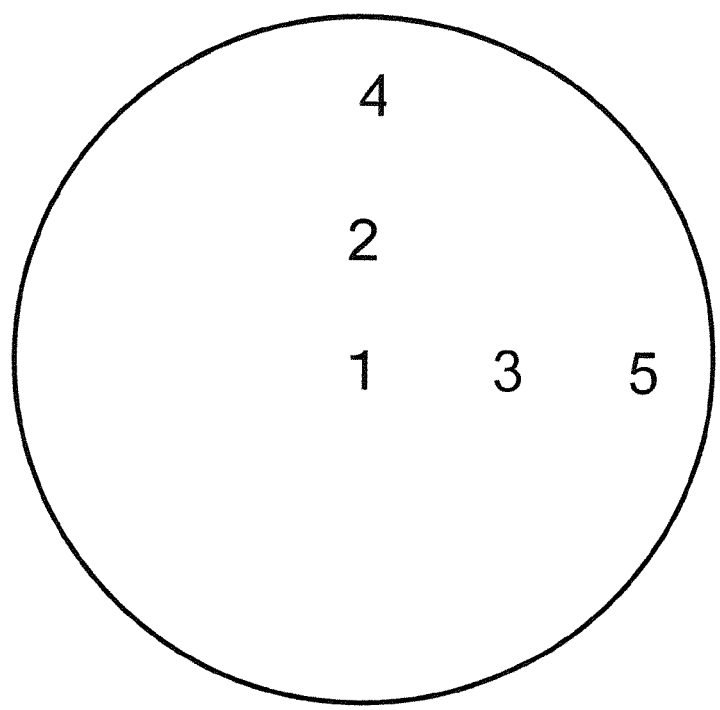
FIG. 1 is a schematic diagram showing the locations where the crystal grain size of the target was measured in the Examples and Comparative Examples of the present invention.
Figure 2:
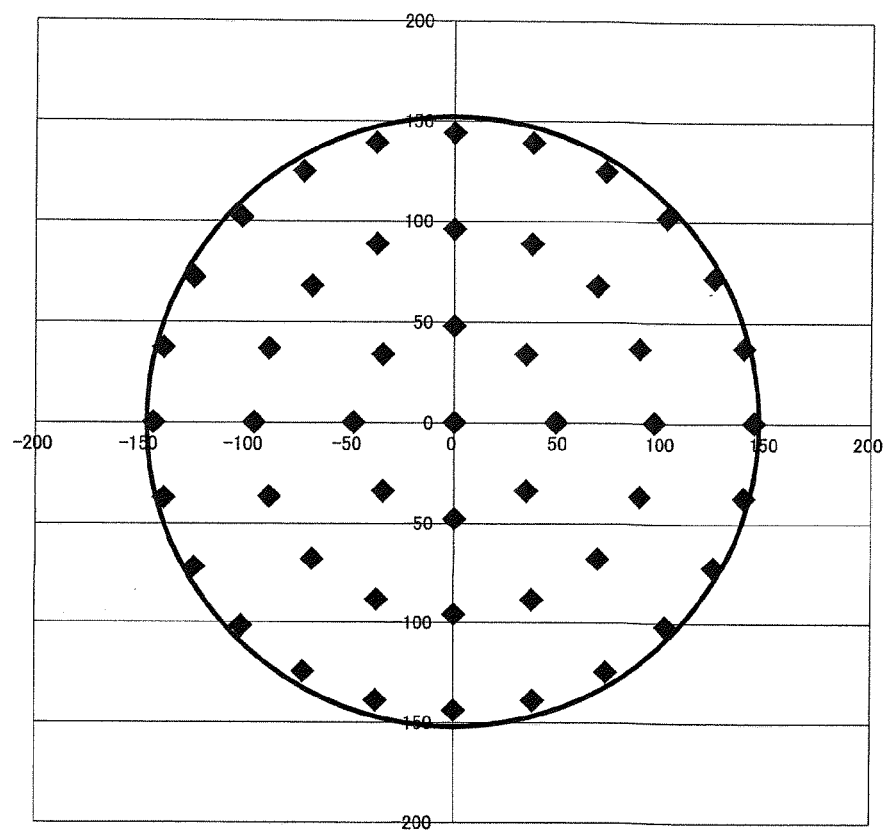
FIG. 2 is a schematic diagram showing the locations where the sheet resistance value and the film thickness of the thin film were measured in the Examples and Comparative Examples of the present invention.

The tantalum sputtering target of the present invention can be produced based on the following processes.

Foremost, high purity tantalum having a purity of 99.99% or higher is prepared as a tantalum raw material. While there is no particular limitation regarding the purity, high purity tantalum is preferably used in order to acquire favorable device properties.

Next, the tantalum raw material is melted via electron beam melting or other methods, and then cast to prepare an ingot or a billet. Subsequently, the ingot or the billet is subject to a series of processes such as heat treatment, forging, heat treatment, rolling, heat treatment, and finish processing.

For example, the sputtering target of the present invention can be obtained by subjecting the ingot to heat treatment at a temperature of 900° C. to 1400° C., cold forging (upset forging and extend forging), heat treatment at a temperature of 850° C. to 1100° C., cold (hot) rolling, heat treatment at a temperature of 750° C. to 1100° C., and finish processing (machine processing, polish processing, etc.).

In the foregoing manufacturing processes, cold forging and the subsequent heat treatment may be performed as one cycle, but may also be repeated as needed. Moreover, cold (hot) rolling and the subsequent heat treatment may be performed as one cycle, but may also be repeated as needed. It is thereby possible to effectively reduce the structural defects of the target.

The cast structure can be destroyed and pores and segregations can be diffused or eliminated by forging or rolling the ingot, and, by additionally heat-treating the forged or rolled ingot, recrystallization is achieved, and by repeating the foregoing forging or rolling and heat treatment processes, it is possible to densify and refine the target structure and increase the target strength.

In the present invention, in order to control the variation in the average crystal grain size of the target, it is desirable to perform forging so that the true strain becomes 3.0 or more and 5.0 or less. Here, true strain is calculated from the ratio of the height of the ingot or billet before and after forging. For example, when the thickness of the billet before forging is "a", and the thickness of the billet after forging is "b", the true strain can be calculated as ln(a/b) (ln is a natural logarithmic). When the foregoing cold forging and subsequent heat treatment are repeatedly performed, the true strain is evaluated based on the integrated value $\Sigma$ ln(a/b) of the overall forging process.

Moreover, in the present invention, the heat-treated forged product is desirably subject to cold (hot) rolling at a rolling reduction of 80% or higher and 90% or less. It is thereby possible to eliminate the non-recrystallized structure, and adjust the variation in the crystal grain size to be within the intended range.

Moreover, in the present invention, it is necessary to destroy the cast structure based on casting and rolling as well as sufficiently perform recrystallization in the series of manufacturing processes. In the present invention, it is desirable to refine and uniformize the structure by subjecting the melted and cast tantalum ingot or billet to post-casting heat treatment at a temperature of 900° C. to 1400° C., and post-rolling heat treatment at a temperature of 750° C. to 1000° C.

With the structure of the tantalum sputtering target obtained as described above, the average crystal grain size will be 50 μm or more and 200 μm or less, and the variation of the crystal grain size in the target plane will be 40% or higher and 60% or less. Accordingly, the present invention can obtain a tantalum sputtering target in which the variation in the crystal grain size of the target is controlled.

In the present invention, the variation in the crystal grain size is 40% or higher and 60% or less, and more preferably 40% or higher 50% or less. When the variation in the crystal grain size is too great, the variation in the film thickness uniformity and specific resistance of the thin film obtained via sputter deposition will deteriorate. Meanwhile, by leaving a certain level of variation in the crystal grain size, the target structure will become a duplex grain structure, and stable sputtering characteristics can be obtained.

Variation in the crystal grain size was obtained by measuring the crystal grain size at five locations in the target plane, calculating the average value and standard deviation thereof, and attaining variation (%)=standard deviation/average value×100.

Note that the crystal grain size was measured by using analySIS FIVE (Soft Imaging System) to analyze the crystal structure photograph taken with an optical microscope in a visual field of 1500 μm×1200 μm. The crystal grain size was calculated in accordance with the average crystal grain size area method of ASTM, and the area of the crystal grains was converted into a circle, and the diameter of that circle was used as the crystal grain size. Moreover, the crystal grain size was measured at a total of five locations as shown in FIG. 1; namely, one location at the center of the target, two locations at the R (diameter)×½ point, and two locations at the R point (outer peripheral part) were sampled.

With the thin film formed by sputtering the target of the present invention, the variation in the sheet resistance Rs relative to the target life is 5.0% or less, preferably 4.0% or less, and more preferably 3.0% or less. Moreover, the smaller the variation of the sheet resistance Rs, the better, and the present invention can achieve up to around 2.2%.

Here, the term "target life" refers to the life of a target from the start of use of that target to the time that the target can no longer be used as a result of the decrease in the target thickness caused by the advancement or erosion due to the sputtering phenomenon.

The target life can be represented based on the integration of the power during sputtering and the total sputtering time and, for example, when the power is 15 kW, the target life of a target that can be used for 100 hours will be 1500 kWh.

In the present invention, the variation in the sheet resistance Rs relative to the target life was obtained by sputtering one wafer for each 300 kWh and obtaining the average value of the sheet resistance Rs at 49 locations in the respective wafer planes, using the obtained average value to calculate the average value and the standard deviation among the wafers, and attaining variation (%) relative to target life=standard deviation among wafers/average value among wafers×100.

Note that the sheet resistance was measured at a total of 49 locations; namely, one location at the center of the wafer, 8 locations at the R (diameter)×⅓ point (45° intervals), 16 locations at the R (diameter)×⅔ point (22.5° intervals), and 24 locations at the R point (outer peripheral part) (15° intervals) were sampled.

Moreover, with the thin film formed by sputtering the target of the present invention, the variation in the film thickness uniformity relative to the target life is 5.0% or less, preferably 4.0% or less, and more preferably 3.0% or less. Moreover, the smaller the variation of the film thickness uniformity, the better, and the present invention can achieve up to around 1.2%.

In the present invention, the variation in the film thickness uniformity relative to the target life was obtained by sputtering one wafer for each 300 kWh and obtaining the average value of the film thickness at 49 locations in the respective wafer planes, using the obtained average value to calculate the average value and the standard deviation among the wafers, and attaining variation (%) in film thickness uniformity relative to target life=standard deviation among wafers/average value among wafers×100.

Note that the film thickness was measured at a total of 49 locations; namely, one location at the center of the wafer, 8 locations at the R (diameter)×⅓ point (45° intervals), 16 locations at the R (diameter)×⅔ point (22.5° intervals), and 24 locations at the R point (outer peripheral part) (15° intervals) were sampled.

EXAMPLES

The present invention is now explained based on the following Examples and Comparative Examples. Note that the following Examples are merely illustrative, and the present invention is not in any way limited by these Examples. In other words, the present invention is limited only by its scope of patent claims, and covers various modifications other than the Examples included in the present invention.

Example 1

A tantalum raw material having a purity of 99.997% was subject to electron beam melting, and then cast to obtain a billet having a thickness of 54 mm and a diameter of 195 mmφ. The obtained billet was thereafter heat-treated at 1200° C. Subsequently, the billet was subject to extend forging at room temperature, and thereafter heat-treated at a temperature of 900° C. Subsequently, the billet was subject to extend forging and upset forging at room temperature, and once again heat-treated at 900° C. Subsequently, the billet was once again subject to extend forging and upset forging at room temperature, and heat-treated at a temperature of 900° C. As a result of repeating the forging and heat treatment processes as described above, the integrated value of the true strain of the overall forging process was 4.1. Subsequently, the billet was subject to cold rolling at a rolling reduction of 88% and thereafter heat-treated at 800° C., and then subject to finish processing to obtain a target having a thickness of 10 mm and a diameter of 450 mmφ.

As a result of using an electron microscope and analyzing the target obtained from the foregoing processes, the average crystal grain size was 68.1 µm, and the variation thereof was 47.9%. Moreover, this target was sputtered to form a tantalum thin film on a silicon wafer (12-inch), and the sheet resistance was measured. As a result, as shown in Table 1, the variation in the sheet resistance Rs was 2.3% and the variation in the film thickness uniformity was 2.0% and small in both cases, and an extremely favorable thin film with superior uniformity was obtained.

Example 2

A tantalum raw material having a purity of 99.997% was subject to electron beam melting, and then cast to obtain a billet having a thickness of 54 mm and a diameter of 195 mmφ. The obtained billet was thereafter heat-treated at 1100° C. Subsequently, the billet was subject to extend forging at room temperature, and thereafter heat-treated at a temperature of 900° C. Subsequently, the billet was subject to extend forging and upset forging at room temperature, and once again heat-treated at 900° C. Subsequently, the billet was once again subject to extend forging and upset forging at room temperature, and heat-treated at a temperature of 900° C. As a result of repeating the forging and heat treatment processes as described above, the integrated value of the true strain of the overall forging process was 4.1. Subsequently, the billet was subject to cold rolling at a rolling reduction of 88% and thereafter heat-treated at 800° C., and then subject to finish processing to obtain a target having a thickness of 10 mm and a diameter of 450 mmφ.

As a result of using an electron microscope and analyzing the target obtained from the foregoing processes, the average crystal grain size was 69.7 µm, and the variation thereof was 47.3%. Moreover, this target was sputtered to form a tantalum thin film on a silicon wafer (12-inch), and the sheet resistance was measured. As a result, as shown in Table 1, the variation in the sheet resistance Rs was 4.5% and the variation in the film thickness uniformity was 1.2% and small in both cases, and an extremely favorable thin film with superior uniformity was obtained.

Example 3

A tantalum raw material having a purity of 99.997% was subject to electron beam melting, and then cast to obtain a billet having a thickness of 54 mm and a diameter of 195 mmφ. The obtained billet was thereafter heat-treated at 1200° C. Subsequently, the billet was subject to extend forging at room temperature, and thereafter heat-treated at a temperature of 900° C. Subsequently, the billet was subject to extend forging and upset forging at room temperature, and once again heat-treated at 900° C. Subsequently, the billet was once again subject to extend forging and upset forging at room temperature, and heat-treated at a temperature of 900° C. As a result of repeating the forging and heat treatment processes as described above, the integrated value of the true strain of the overall forging process was 4.0. Subsequently, the billet was subject to cold rolling at a rolling reduction of 87% and thereafter heat-treated at 850° C., and then subject to finish processing to obtain a target having a thickness of 10 mm and a diameter of 450 mmφ.

As a result of using an electron microscope and analyzing the target obtained from the foregoing processes, the average crystal grain size was 71.0 µm, and the variation thereof was 50.1%. Moreover, this target was sputtered to form a tantalum thin film on a silicon wafer (12-inch), and the sheet resistance was measured. As a result, as shown in Table 1, the variation in the sheet resistance Rs was 3.7% and the variation in the film thickness uniformity was 1.2% and small in both cases, and an extremely favorable thin film with superior uniformity was obtained.

Example 4

A tantalum raw material having a purity of 99.997% was subject to electron beam melting, and then cast to obtain a billet having a thickness of 54 mm and a diameter of 195 mmφ. The obtained billet was thereafter heat-treated at 1000° C. Subsequently, the billet was subject to extend forging at room temperature, and thereafter heat-treated at a temperature of 900° C. Subsequently, the billet was subject to extend forging and upset forging at room temperature, and once again heat-treated at 900° C. Subsequently, the billet was once again subject to extend forging and upset forging at room temperature, and heat-treated at a temperature of 900° C. As a result of repeating the forging and heat treatment processes as described above, the integrated value of the true strain of the overall forging process was 4.2. Subsequently, the billet was subject to cold rolling at a rolling reduction of 88% and thereafter heat-treated at 800° C., and then subject to finish processing to obtain a target having a thickness of 10 mm and a diameter of 450 mmφ.

As a result of using an electron microscope and analyzing the target obtained from the foregoing processes, the average crystal grain size was 67.9 μm, and the variation thereof was 48.2%. Moreover, this target was sputtered to form a tantalum thin film on a silicon wafer (12-inch), and the sheet resistance was measured. As a result, as shown in Table 1, the variation in the sheet resistance Rs was 2.3% and the variation in the film thickness uniformity was 2.1% and small in both cases, and an extremely favorable thin film with superior uniformity was obtained.

Example 5

A tantalum raw material having a purity of 99.997% was subject to electron beam melting, and then cast to obtain a billet having a thickness of 54 mm and a diameter of 195 mmφ. The obtained billet was thereafter heat-treated at 1300° C. Subsequently, the billet was subject to extend forging at room temperature, and thereafter heat-treated at a temperature of 900° C. Subsequently, the billet was subject to extend forging and upset forging at room temperature, and once again heat-treated at 900° C. Subsequently, the billet was once again subject to extend forging and upset forging at room temperature, and heat-treated at a temperature of 900° C. As a result of repeating the forging and heat treatment processes as described above, the integrated value of the true strain of the overall forging process was 4.2. Subsequently, the billet was subject to cold rolling at a rolling reduction of 88% and thereafter heat-treated at 800° C., and then subject to finish processing to obtain a target having a thickness of 10 mm and a diameter of 450 mmφ.

As a result of using an electron microscope and analyzing the target obtained from the foregoing processes, the average crystal grain size was 70.3 μm, and the variation thereof was 48.2%. Moreover, this target was sputtered to form a tantalum thin film on a silicon wafer (12-inch), and the sheet resistance was measured. As a result, as shown in Table 1, the variation in the sheet resistance Rs was 2.2% and the variation in the film thickness uniformity was 3.9% and small in both cases, and an extremely favorable thin film with superior uniformity was obtained.

Example 6

A tantalum raw material having a purity of 99.997% was subject to electron beam melting, and then cast to obtain a billet having a thickness of 54 mm and a diameter of 195 mmφ. The obtained billet was thereafter heat-treated at 1350° C. Subsequently, the billet was subject to extend forging at room temperature, and thereafter heat-treated at a temperature of 850° C. Subsequently, the billet was subject to extend forging and upset forging at room temperature, and once again heat-treated at 850° C. Subsequently, the billet was once again subject to extend forging and upset forging at room temperature, and heat-treated at a temperature of 850° C. As a result of repeating the forging and heat treatment processes as described above, the integrated value of the true strain of the overall forging process was 4.4. Subsequently, the billet was subject to cold rolling at a rolling reduction of 89% and thereafter heat-treated at 750° C., and then subject to finish processing to obtain a target having a thickness of 10 mm and a diameter of 450 mmφ.

As a result of using an electron microscope and analyzing the target obtained from the foregoing processes, the average crystal grain size was 34.4 μm, and the variation thereof was 53.6%. Moreover, this target was sputtered to form a tantalum thin film on a silicon wafer (12-inch), and the sheet resistance was measured. As a result, as shown in Table 1, the variation in the sheet resistance Rs was 3.5% and the variation in the film thickness uniformity was 4.7% and small in both cases, and an extremely favorable thin film with superior uniformity was obtained.

Example 7

A tantalum raw material having a purity of 99.997% was subject to electron beam melting, and then cast to obtain a billet having a thickness of 54 mm and a diameter of 195 mmφ. The obtained billet was thereafter heat-treated at 1200° C. Subsequently, the billet was subject to extend forging at room temperature, and thereafter heat-treated at a temperature of 1100° C. Subsequently, the billet was subject to extend forging and upset forging at room temperature, and once again heat-treated at 1100° C. Subsequently, the billet was once again subject to extend forging and upset forging at room temperature, and heat-treated at a temperature of 1100° C. As a result of repeating the forging and heat treatment processes as described above, the integrated value of the true strain of the overall forging process was 3.8. Subsequently, the billet was subject to cold rolling at a rolling reduction of 85% and thereafter heat-treated at 1000° C., and then subject to finish processing to obtain a target having a thickness of 10 mm and a diameter of 450 mmφ. As a result of using an electron microscope and analyzing the target obtained from the foregoing processes, the average crystal grain size was 154.3 μm, and the variation thereof was 43.4%. Moreover, this target was sputtered to form a tantalum thin film on a silicon wafer (12-inch), and the sheet resistance was measured. As a result, as shown in Table 1, the variation in the sheet resistance Rs was 3.0% and the variation in the film thickness uniformity was 2.6% and small in both cases, and an extremely favorable thin film with superior uniformity was obtained.

Example 8

A tantalum raw material having a purity of 99.997% was subject to electron beam melting, and then cast to obtain a billet having a thickness of 54 mm and a diameter of 195 mmφ. The obtained billet was thereafter heat-treated at 1200° C. Subsequently, the billet was subject to extend forging at room temperature, and thereafter heat-treated at a temperature of 1000° C. Subsequently, the billet was subject to extend forging and upset forging at room temperature, and once again heat-treated at 1000° C. Subsequently, the billet was once again subject to extend forging and upset forging at room temperature, and heat-treated at a temperature of 1000° C. As a result of repeating the forging and heat treatment processes as described above, the integrated value of the true strain of the overall forging process was 3.6. Subsequently, the billet was subject to cold rolling at a rolling reduction of 82% and thereafter heat-treated at 900° C., and then subject to finish processing to obtain a target having a thickness of 10 mm and a diameter of 450 mmφ.

As a result of using an electron microscope and analyzing the target obtained from the foregoing processes, the average crystal grain size was 102.1 μm, and the variation thereof was 46.3%. Moreover, this target was sputtered to form a tantalum thin film on a silicon wafer (12-inch), and the sheet resistance was measured. As a result, as shown in Table 1, the variation in the sheet resistance Rs was 3.1% and the variation in the film thickness uniformity was 3.8% and small in both cases, and an extremely favorable thin film with superior uniformity was obtained.

Comparative Example 1

A tantalum raw material having a purity of 99.997% was subject to electron beam melting, and then cast to obtain a billet having a thickness of 54 mm and a diameter of 195 mmφ. The obtained billet was thereafter heat-treated at 1200° C. Subsequently, the billet was subject to extend forging at room temperature, and thereafter heat-treated at a temperature of 1100° C. Subsequently, the billet was subject to extend forging and upset forging at room temperature, and once again heat-treated at 1100° C. Subsequently, the billet was once again subject to extend forging and upset forging at room temperature, and heat-treated at a temperature of 1100° C. As a result of repeating the forging and heat treatment processes as described above, the integrated value of the true strain of the overall forging process was 2.2. Subsequently, the billet was subject to cold rolling at a rolling reduction of 82% and thereafter heat-treated at 1000° C., and then subject to finish processing to obtain a target having a thickness of 10 mm and a diameter of 450 mmφ.

As a result of using an electron microscope and analyzing the target obtained from the foregoing processes, the average crystal grain size was 137.9 μm, and the variation thereof was 36.7%. Moreover, this target was sputtered to form a tantalum thin film on a silicon wafer (12-inch), and the sheet resistance was measured. As a result, as shown in Table 1, while the variation in the sheet resistance Rs was small at 3.2%, the variation in the film thickness uniformity was great at 6.9%, and a thin film with inferior uniformity was obtained.

Comparative Example 2

A tantalum raw material having a purity of 99.997% was subject to electron beam melting, and then cast to obtain a billet having a thickness of 54 mm and a diameter of 195 mmφ. The obtained billet was thereafter heat-treated at 1100° C. Subsequently, the billet was subject to extend forging at room temperature, and thereafter heat-treated at a temperature of 1100° C. Subsequently, the billet was subject to extend forging and upset forging at room temperature, and once again heat-treated at 1100° C. Subsequently, the billet was once again subject to extend forging and upset forging at room temperature, and heat-treated at a temperature of 1100° C. As a result of repeating the forging and heat treatment processes as described above, the integrated value of the true strain of the overall forging process was 2.4. Subsequently, the billet was subject to cold rolling at a rolling reduction of 82% and thereafter heat-treated at 1000° C., and then subject to finish processing to obtain a target having a thickness of 10 mm and a diameter of 450 mmφ.

As a result of using an electron microscope and analyzing the target obtained from the foregoing processes, the average crystal grain size was 137.0 μm, and the variation thereof was 36.1%. Moreover, this target was sputtered to form a tantalum thin film on a silicon wafer (12-inch), and the sheet resistance was measured. As a result, as shown in Table 1, the variation in the sheet resistance Rs was 6.3% and the variation in the film thickness uniformity was 5.3% and great in both cases, and a thin film with extremely inferior uniformity was obtained.

Comparative Example 3

A tantalum raw material having a purity of 99.997% was subject to electron beam melting, and then cast to obtain a billet having a thickness of 54 mm and a diameter of 195 amφ. The obtained billet was thereafter heat-treated at 1350° C. Subsequently, the billet was subject to extend forging at room temperature, and thereafter heat-treated at a temperature of 1100° C. Subsequently, the billet was subject to extend forging and upset forging at room temperature, and once again heat-treated at 1100° C. Subsequently, the billet was once again subject to extend forging and upset forging at room temperature, and heat-treated at a temperature of 1100° C. As a result of repeating the forging and heat treatment processes as described above, the integrated value of the true strain of the overall forging process was 2.2. Subsequently, the billet was subject to cold rolling at a rolling reduction of 82% and thereafter heat-treated at 1000° C., and then subject to finish processing to obtain a target having a thickness of 10 mm and a diameter of 450 mmφ.

As a result of using an electron microscope and analyzing the target obtained from the foregoing processes, the average crystal grain size was 135.9 μm, and the variation thereof was 37.3%. Moreover, this target was sputtered to form a tantalum thin film on a silicon wafer (12-inch), and the sheet resistance was measured. As a result, as shown in Table 1, while the variation in the sheet resistance Rs was small at 4.6%, the variation in the film thickness uniformity was great at 6.3%, and a thin film with inferior uniformity was obtained.

Comparative Example 4

A tantalum raw material having a purity of 99.997% was subject to electron beam melting, and then cast to obtain a billet having a thickness of 54 mm and a diameter of 195 mmφ. The obtained billet was thereafter heat-treated at 1300° C. Subsequently, the billet was subject to extend forging at room temperature, and thereafter heat-treated at a temperature of 900° C. Subsequently, the billet was subject to extend forging and upset forging at room temperature, and once again heat-treated at 900° C. Subsequently, the billet was once again subject to extend forging and upset forging at room temperature, and heat-treated at a temperature of 900° C. As a result of repeating the forging and heat treatment processes as described above, the integrated value of the true strain of the overall forging process was 5.2. Subsequently, the billet was subject to cold rolling at a rolling reduction of 91% and thereafter heat-treated at 800°

C., and then subject to finish processing to obtain a target having a thickness of 10 mm and a diameter of 450 mmφ.

As a result of using an electron microscope and analyzing the target obtained from the foregoing processes, the average crystal grain size was 50.0 µm, and the variation thereof was 23.6%. Moreover, this target was sputtered to form a tantalum thin film on a silicon wafer (12-inch), and the sheet resistance was measured. As a result, as shown in Table 1, while the variation in the film thickness uniformity was small at 3.5%, the variation in the sheet resistance Rs was great at 6.5%, and a thin film with inferior uniformity was obtained.

Comparative Example 5

A tantalum raw material having a purity of 99.997% was subject to electron beam melting, and then cast to obtain a billet having a thickness of 54 mm and a diameter of 195 mmφ. The obtained billet was thereafter heat-treated at 1100° C. Subsequently, the billet was subject to extend forging at room temperature, and thereafter heat-treated at a temperature of 900° C. Subsequently, the billet was subject to extend forging and upset forging at room temperature, and once again heat-treated at 900° C. Subsequently, the billet was once again subject to extend forging and upset forging at room temperature, and heat-treated at a temperature of 900° C. As a result of repeating the forging and heat treatment processes as described above, the integrated value of the true strain of the overall forging process was 5.3. Subsequently, the billet was subject to cold rolling at a rolling reduction of 91% and thereafter heat-treated at 800° C., and then subject to finish processing to obtain a target having a thickness of 10 mm and a diameter of 450 mmφ.

As a result of using an electron microscope and analyzing the target obtained from the foregoing processes, the average crystal grain size was 67.1 µm, and the variation thereof was 22.2%. Moreover, this target was sputtered to form a tantalum thin film on a silicon wafer (12-inch), and the sheet resistance was measured. As a result, as shown in Table 1, while the variation in the sheet resistance Rs was small at 3.7%, the variation in the film thickness uniformity was great at 6.3%, and a thin film with inferior uniformity was obtained.

Comparative Example 6

A tantalum raw material having a purity of 99.997% was subject to electron beam melting, and then cast to obtain a billet having a thickness of 54 mm and a diameter of 195 mmφ. The obtained billet was thereafter heat-treated at 1300° C. Subsequently, the billet was subject to extend forging at room temperature, and thereafter heat-treated at a temperature of 1000° C. Subsequently, the billet was subject to extend forging and upset forging at room temperature, and once again heat-treated at 1000° C. Subsequently, the billet was once again subject to extend forging and upset forging at room temperature, and heat-treated at a temperature of 1000° C. As a result of repeating the forging and heat treatment processes as described above, the integrated value of the true strain of the overall forging process was 5.5. Subsequently, the billet was subject to cold rolling at a rolling reduction of 95% and thereafter heat-treated at 900° C., and then subject to finish processing to obtain a target having a thickness of 10 mm and a diameter of 450 mmφ.

As a result of using an electron microscope and analyzing the target obtained from the foregoing processes, the average crystal grain size was 99.8 µm, and the variation thereof was 35.8%. Moreover, this target was sputtered to form a tantalum thin film on a silicon wafer (12-inch), and the sheet resistance was measured. As a result, as shown in Table 1, while the variation in the sheet resistance Rs was small at 2.9%, the variation in the film thickness uniformity was great at 5.6%, and a thin film with inferior uniformity was obtained.

Comparative Example 7

A tantalum raw material having a purity of 99.997% was subject to electron beam melting, and then cast to obtain a billet having a thickness of 54 mm and a diameter of 195 mmφ. The obtained billet was thereafter heat-treated at 1100° C. Subsequently, the billet was subject to extend forging at room temperature, and thereafter heat-treated at a temperature of 850° C. Subsequently, the billet was subject to extend forging and upset forging at room temperature, and once again heat-treated at 850° C. Subsequently, the billet was once again subject to extend forging and upset forging at room temperature, and heat-treated at a temperature of 850° C. As a result of repeating the forging and heat treatment processes as described above, the integrated value of the true strain of the overall forging process was 5.4. Subsequently, the billet was subject to cold rolling at a rolling reduction of 95% and thereafter heat-treated at 775° C., and then subject to finish processing to obtain a target having a thickness of 10 mm and a diameter of 450 mmφ.

As a result of using an electron microscope and analyzing the target obtained from the foregoing processes, the average crystal grain size was 39.0 µm, and the variation thereof was 66.2%. Moreover, this target was sputtered to form a tantalum thin film on a silicon wafer (12-inch), and the sheet resistance was measured. As a result, as shown in Table 1, while the variation in the sheet resistance Rs was small at 2.8%, the variation in the film thickness uniformity was great at 17.3%, and a thin film with inferior uniformity was obtained.

Comparative Example 8

A tantalum raw material having a purity of 99.997% was subject to electron beam melting, and then cast to obtain a billet having a thickness of 54 mm and a diameter of 195 mmφ. The obtained billet was thereafter heat-treated at 1200° C. Subsequently, the billet was subject to extend forging at room temperature, and thereafter heat-treated at a temperature of 1200° C. Subsequently, the billet was subject to extend forging and upset forging at room temperature, and once again heat-treated at 1200° C. Subsequently, the billet was once again subject to extend forging and upset forging at room temperature, and heat-treated at a temperature of 1200° C. As a result of repeating the forging and heat treatment processes as described above, the integrated value of the true strain of the overall forging process was 2.0. Subsequently, the billet was subject to cold rolling at a rolling reduction of 80% and thereafter heat-treated at 1100° C., and then subject to finish processing to obtain a target having a thickness of 10 mm and a diameter of 450 mmφ. As a result of using an electron microscope and analyzing the target obtained from the foregoing processes, the average crystal grain size was 214.3 µm, and the variation thereof was 67.2%. Moreover, this target was sputtered to form a tantalum thin film on a silicon wafer (12-inch), and the sheet resistance was measured. As a result, as shown in Table 1, the variation in the sheet resistance Rs was 6.6% and the variation in the film thickness uniformity was 16.2% and great in both cases, and a thin film with inferior uniformity was obtained.

TABLE 1

| | Heat treatment temp. after casting (° C.) | Integrated value of true strain of forging process | Heat treatment temp. after forging (° C.) | Rolling reduction (%) | Heat treatment temp. after rolling (° C.) | Crystal grain size of target Avg. (μm) | Crystal grain size of target Min. (μm) |
|---|---|---|---|---|---|---|---|
| Example 1 | 1200 | 4.1 | 900 | 88 | 800 | 68.1 | 30.1 |
| Example 2 | 1100 | 4.1 | 900 | 88 | 800 | 69.7 | 30.1 |
| Example 3 | 1200 | 4.0 | 900 | 87 | 850 | 71.0 | 30.2 |
| Example 4 | 1000 | 4.2 | 900 | 88 | 800 | 67.9 | 30.1 |
| Example 5 | 1300 | 4.2 | 900 | 88 | 800 | 70.3 | 30.1 |
| Example 6 | 1350 | 4.4 | 850 | 89 | 750 | 34.4 | 2.1 |
| Example 7 | 1200 | 3.8 | 1100 | 85 | 1000 | 154.3 | 50.2 |
| Example 8 | 1200 | 3.6 | 1000 | 82 | 900 | 102.1 | 40.6 |
| Comparative Example 1 | 1200 | 2.2 | 1100 | 82 | 1000 | 137.9 | 68.2 |
| Comparative Example 2 | 1100 | 2.4 | 1100 | 82 | 1000 | 137.0 | 59.8 |
| Comparative Example 3 | 1350 | 2.2 | 1100 | 82 | 1000 | 135.9 | 62.3 |
| Comparative Example 4 | 1300 | 5.2 | 900 | 91 | 800 | 50.0 | 32.4 |
| Comparative Example 5 | 1100 | 5.3 | 900 | 91 | 800 | 67.1 | 40.1 |
| Comparative Example 6 | 1300 | 5.5 | 1000 | 95 | 900 | 99.8 | 30.3 |
| Comparative Example 7 | 1100 | 5.4 | 850 | 95 | 775 | 39.0 | 1.3 |
| Comparative Example 8 | 1200 | 2.0 | 1200 | 80 | 1100 | 214.3 | 72.6 |

| | Crystal grain size of target Max. (μm) | Crystal grain size of target Variation | Sheet resistance Rs variation | Film thickness variation | Determination* |
|---|---|---|---|---|---|
| Example 1 | 194.0 | 47.9% | 2.3% | 2.0% | ⊚ |
| Example 2 | 204.1 | 47.3% | 4.5% | 1.2% | ○ |
| Example 3 | 234.5 | 50.1% | 3.7% | 1.2% | ○ |
| Example 4 | 199.7 | 48.2% | 2.3% | 2.1% | ⊚ |
| Example 5 | 199.2 | 48.2% | 2.2% | 3.9% | ○ |
| Example 6 | 69.0 | 53.6% | 3.5% | 4.7% | ○ |
| Example 7 | 282.9 | 43.4% | 3.0% | 2.6% | ⊚ |
| Example 8 | 185.4 | 46.3% | 3.1% | 3.8% | ○ |
| Comparative Example 1 | 242.9 | 36.7% | 3.2% | 6.9% | X |
| Comparative Example 2 | 233.7 | 36.1% | 6.3% | 5.3% | X |
| Comparative Example 3 | 239.8 | 37.3% | 4.6% | 6.3% | X |
| Comparative Example 4 | 69.1 | 23.6% | 6.5% | 3.5% | X |
| Comparative Example 5 | 90.8 | 22.2% | 3.7% | 6.3% | X |
| Comparative Example 6 | 159.5 | 35.8% | 2.9% | 5.6% | X |
| Comparative Example 7 | 73.1 | 66.2% | 2.8% | 17.3% | X |
| Comparative Example 8 | 393.2 | 67.2% | 6.6% | 16.2% | X |

Determination:
⊚ shows that the sheet resistance Rs variation is 3% or less, and the film thickness variation is within 3%.
○ shows that the sheet resistance Rs variation is greater than 3% and 5% or less, or the film thickness variation is greater than 3% and within 5%.
X shows that the sheet resistance Rs variation and/or the film thickness variation exceeds 5%.

As described above, in all cases of Examples 1 to 8, it was confirmed that the variation in the average crystal grain size of the tantalum target is 40% or higher and 60% or less. Thus, it has been confirmed that this kind of structure plays an extremely important role for uniformizing the film thickness and the specific resistance.

Moreover, in Examples 1 to 8, while the series of processes of forging and heat treatment was repeated three to four times, favorable results were obtained when the true strain was 3.0 or more and 5.0 or less even when the foregoing series of processes was performed only once or repeated in a number other than three or four times.

As a result of controlling the variation in the average crystal grain size of a tantalum sputtering target, the present invention can improve the uniformity of the film thickness and specific resistance of the thin film formed using the foregoing target. Accordingly, fine wiring can be stably produced by using the target of the present invention. The present invention is useful as a tantalum sputtering target that is used for the deposition of a barrier film for a wire layer in a semiconductor device.

The invention claimed is:

1. A tantalum sputtering target, wherein an average crystal grain size of the target is 50 μm or more and 200 μm or less, and variation of a crystal grain size in the target plane is 40% or higher and 50% or less on a surface of the target, wherein the variation is defined as a ratio of standard deviation to an average of five average crystal grain sizes measured at five different locations selected on the surface of the sputtering target.

2. A method of producing a tantalum sputtering target wherein an ingot or a billet obtained by subjecting a tantalum raw material to electron beam melting and casting is heat treated at a temperature of 900° C. or higher and 1400° C. lower, subsequently subjected to cold forging processing consisting of upset forging and extend forging by a total amount of true strain of 3.0 or more and 5.0 or less, thereafter heat-treated at 850° C. or higher and 1100° C. lower subsequently rolled at a rolling reduction of 80% or higher and 90% or less, thereafter heat-treated at 750° C. or higher and 1000° C. lower, and additionally subject to finish processing to obtain a target, wherein an average crystal grain size of the target is 50 micrometers or more and 200 micrometers or less, and a variation of crystal grain size in a target plane is 40% or higher and 50% or less on a surface of the target, wherein the variation is defined as a ratio of standard deviation to an average of five average crystal grain sizes measured at five different locations selected on the surface of the sputtering target.

* * * * *

UNITED STATES PATENT AND TRADEMARK OFFICE
CERTIFICATE OF CORRECTION

PATENT NO. : 9,890,452 B2
APPLICATION NO. : 14/384749
DATED : February 13, 2018
INVENTOR(S) : Kotaro Nagatsu et al.

It is certified that error appears in the above-identified patent and that said Letters Patent is hereby corrected as shown below:

In the Claims

Column 15, Line 14, Claim 2 "C. lower" should read "C. or lower"

Column 15, Lines 17-18, Claim 2 "C. lower" should read "C. or lower"

Column 15, Line 20, Claim 2 "C. lower" should read "C. or lower"

Signed and Sealed this
Twenty-fifth Day of September, 2018

Andrei Iancu
*Director of the United States Patent and Trademark Office*